(12) United States Patent
Thacker et al.

(10) Patent No.: US 8,823,416 B2
(45) Date of Patent: Sep. 2, 2014

(54) USE OF PLL STABILITY FOR ISLANDING DETECTION

(75) Inventors: Timothy N. Thacker, Christiansburg, VA (US); Dushan Boroyevich, Blacksburg, VA (US); Fred Wang, Knoxville, TN (US); Rolando Burgos, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 0 days.

(21) Appl. No.: 13/182,978

(22) Filed: Jul. 14, 2011

(65) Prior Publication Data

US 2012/0013376 A1  Jan. 19, 2012

Related U.S. Application Data

(60) Provisional application No. 61/364,206, filed on Jul. 14, 2010.

(51) Int. Cl.
*H03L 7/085* (2006.01)
*H02J 3/38* (2006.01)

(52) U.S. Cl.
CPC ............... *H03L 7/085* (2013.01); *H02J 3/382* (2013.01); *H02J 2003/388* (2013.01); *Y02E 10/763* (2013.01); *H02J 3/383* (2013.01); *Y02E 10/563* (2013.01); *H02J 3/386* (2013.01)
USPC ................. 327/2; 327/156; 331/25; 375/376; 307/87

(58) Field of Classification Search
CPC ...... H03L 7/085; H03L 7/093; H03D 13/005; H03D 13/007; G01R 25/00; G01R 25/005; G01R 25/02; Y02E 10/563; Y02E 10/763

USPC .................. 327/2, 3, 5, 7, 147, 156; 331/25; 375/373, 376; 307/87

See application file for complete search history.

(56) References Cited

U.S. PATENT DOCUMENTS 5,304,957 A * 4/1994 Edwards ..................... 331/12
7,680,234 B2 * 3/2010 Colby et al. ................. 375/376

OTHER PUBLICATIONS

Thacker, T.; Burgos, R.; Wang, F.; Boroyevich, D.; , "Single-phase islanding detection based on phase-locked loop stability," Energy Conversion Congress and Exposition, 2009. ECCE 2009. IEEE , vol., No., pp. 3371-3377, Sep. 20-24, 2009.*

Thacker, T.; Boroyevich, D.; Burgos, R.; Fei Wang; , "Phase-Locked Loop Noise Reduction via Phase Detector Implementation for Single-Phase Systems," Industrial Electronics, IEEE Transactions on , vol. 58, No. 6, pp. 2482-2490, Jun. 2011.*

* cited by examiner

*Primary Examiner* — Patrick O'Neill
(74) *Attorney, Agent, or Firm* — Whitham, Curtis, Christofferson & Cook, P.C.

(57) ABSTRACT

A phase detector for a phase-locked loop includes a phase detector that is configured to become unstable, oscillate and drift rapidly in frequency in a predictable manner when a reference frequency signal is not available. When applied, for example, to a power converter connected to a power distribution grid, the predictable oscillatory and rapid frequency drift behavior when the phase detector is unstable allows very rapid and reliable detection of disconnection from the grid, referred to as islanding.

18 Claims, 13 Drawing Sheets

USE OF PLL STABILITY FOR ISLANDING DETECTION

CROSS-REFERENCE TO RELATED APPLICATIONS

This application claims benefit of priority of U.S. Provisional Application 61/364,206, filed Jul. 14, 2010, which is hereby incorporated by reference in its entirety.

FIELD OF THE INVENTION

The present invention generally relates to voltage source converters (VSCs) connected to power distribution grids and, more particularly, to detection of disconnection of a VSC from the power distribution grid.

BACKGROUND OF THE INVENTION

At the present time, there are relatively few sparsely populated areas worldwide where electrical power is not universally available through public or private utility companies which provide and maintain electrical power distribution network infrastructures. Power is supplied to these networks by generators reliant on fossil fuels or nuclear energy or from so-called renewable resources such as hydroelectric generators, wind turbines or solar collectors; all of which derive power directly or indirectly from heating or radiation effects of the sun. While generators using fossil or nuclear fuels can be located with substantial flexibility, since required fuels can be transported to them, generators using renewable energy sources must generally be placed at locations having environmental conditions favorable to collection of energy, including renewable biologically produced fuels since the energy density of plant material is generally much lower than for fossil fuels. In any case, it is generally the practice to locate power generators, regardless of type, in reasonable proximity to the locations where the major portion of the power that is produced will be consumed, such as near population or industrial centers, since a degree of power loss in the course of transmission is unavoidable, but sufficiently remote therefrom to avoid significant environmental impact to the extent possible. For this reason, a given network will generally be comprised of a portion for distributing large amounts of power at high voltage and with a plurality of phases (generally three) over substantial distances and numerous, more localized portions for distributing power at lower voltages and usually single-phase.

Since demand for power can be highly variable, it has also been the practice to interconnect power distribution networks and portions thereof through a so-called power grid or, simply, "grid", serving wide geographic areas so that power demand can be averaged over greater numbers of consumers. That is, if the demand for electrical power in a given area exceeds the power generations capability of that area, power can be supplied to the area from an adjacent or even remote area where some excess power generation capacity exists. The interconnection of networks and network portions into a grid which can automatically transfer power between networks in accordance with demand, of course, requires all of the networks to be synchronized, generally using phase-locked loops (PLLs) controlling power converters and voltage source converters (VSCs) which can transfer power bi-directionally and provide variable power factor regulation which implies much increased complexity in the construction, operation and maintenance of such a grid. Further, disconnection of any network from the grid may cause a wide variety of unpredictable effects due to transients, resonances and the like that may appear when the topology of the grid is altered by disconnection of one or more networks from the grid. Such a disconnection is referred to as "islanding"; connoting a separation of a network or portion of a network from the main body of the grid. However, islanding also includes other operational abnormalities that extend over some determinable geographic region.

When an islanding event occurs and is detected, a network or network portion is not necessarily de-energized since the network or network portion may include one or more power generation sources or remain potentially connected to the grid through redundant power converters. Therefore, islanding events must be quickly and reliably detected and standards for such detection, notably IEEE-1547.2003 which requires islanding event detection to be achieved, in some cases, within ten cycles of the alternating current on the grid, have been promulgated in the interest of safety of maintenance personnel and to avoid damage to the network, grid or various loads that may be connected to portions of the grid or network. Present islanding event detection arrangements may generally meet this standard but often require close to ideal conditions to be present on the networks and grids. Islanding event detection is necessarily difficult where power generation provided to local loads is normally and predominantly local. Therefore, the amount of power transferred from the grid to a local network is usually very slight. That is, the local load demand is principally supplied by a local VSC and grid current is usually negligible. Therefore, when an islanding fault occurs, the voltage and frequency determined by the local VSC is virtually unaffected since there is negligible interaction of the grid with the load and local system.

Specifically, passive islanding detection methods can theoretically and practically detect abnormalities of interest while functioning normally during all nominal grid and network operating modes but are susceptible to so-called non-detection zones (NDZs); operational conditions (e.g. matched converter/load interaction) of the grid of which passive islanding detection methods cannot detect islanding events. In single-phase systems, known active islanding event detection schemes have involved using distortions injected into the power distribution system (e.g. a network or network portion) to cause instability when the grid is disconnected or non-dominant or use distortions generated in the frequency and/or phase of the reference current or power pulsing or dead-time to detect islanding events. Such distortions, perturbations or disturbances of voltage and/or current in the power distribution system must be substantial with respect to the local demand (whether they are continuous, discontinuous, periodic, etc.) to be effective and can thus lead to local grid stability concerns or potentially cause damage to or improper operation of loads connected to the grid. Furthermore, such active methods do not prevent NDZs but only reduce their size, and if not correctly implemented, will not cause the system to detect an islanding event. Therefore, both passive and active islanding detection methods are far from ideal and allow for significant improvements in islanding detection.

An article entitled "Islanding Detection Using a Coordinate Transformation Phase Locked Loop" by Thacker et al., Power Electronics Specialists Conference, 2007, PESC 2007, IEEE, 2007, pp. 1151-1156, which is hereby fully incorporated by reference, presents a PLL of a grid-connected VSC that can be easily modified such that the estimated frequency of the PLL inherently becomes unstable during the initial transients of an islanding event in a three-phase power distribution system. Such a conditionally unstable system is advantageous for islanding detection since, if the instability is conditioned on the loss of grid connection, then the system will always become unstable when islanding occurs without need for any perturbations when the grid is connected. In that approach, a three-phase PLL will cause initial transients but will not continue to oscillate or have a guaranteed drift of frequency outside the NDZ. However, application of that system is limited to three-phase VSCs while large portions of power distribution grids and networks operate with single-phase power and remain subject to islanding and have required islanding event detection using the far from ideal active and passive detection schemes discussed above.

SUMMARY OF THE INVENTION

It is therefore a basic object of the present invention to provide a phase locked loop control for a power converter which is stable when connected to a power distribution grid but which immediately and inherently becomes unstable under islanding conditions and, in the unstable condition, produces a response from the power converter having readily detectable characteristics but which are sufficiently close to normal operation to avoid damage to devices receiving power from the power converter.

It is another object of the present invention to provide an alternative active islanding event detection arrangement which is inherently of high reliability but does not require perturbations or transients to be injected into the voltage/current power distribution waveforms but only injects perturbations or transients into the voltage/current power distribution waveforms upon grid instability due to an islanding event.

It is another object of the invention to provide reliable islanding detection which meets stringent testing and certification requirements under worst case load-matching conditions.

In order to accomplish these and other objects of the invention, a phase detector, a phase-locked loop circuit including a phase detector and a controller for a power converter including a phase detector are provided wherein the phase detector is configured to compute an error signal, $V_{err}$, in accordance with the equation:

$$V_{err} = A \sin(\theta_e + \psi)\cos(\theta_e) - \sin(\theta_e)\cos(\theta_e)$$

such that the phase detector is stable when a reference frequency signal is available but inherently becomes unstable when such a reference frequency signal is not available. The phase detector in accordance with the invention preferably includes a loop filter, an integrator connected to an output of the loop filter, a first feedback path configured to compute the sine of the output of the integrator, a second feedback path configured to compute the cosine of the output of the integrator, a first multiplier configured to multiply an output of the first feedback path and an output of the second feedback path, a second multiplier configured to multiply the output of said second feedback path by an input, a summation device configured to output a difference of outputs of the first multiplier and the second multiplier, and a connection from an output of the summation device to an input of the loop filter.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
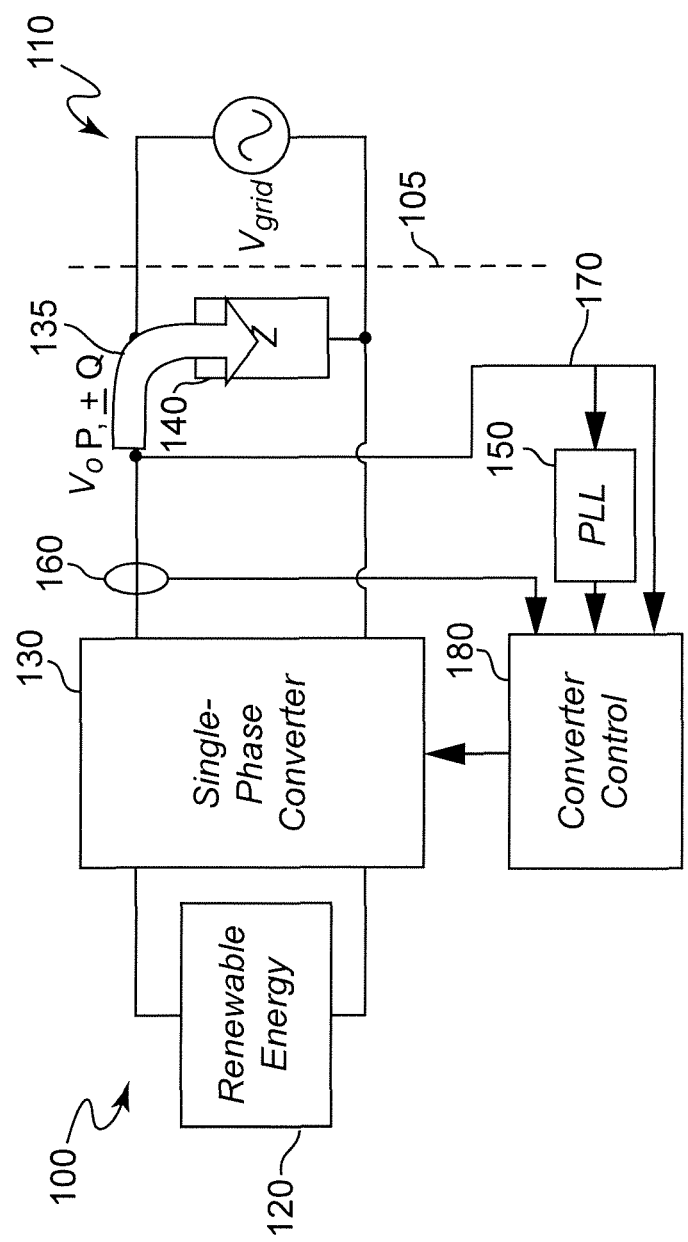
FIG. 1 is a block diagram illustrating a connection of a single phase converter and load to a power distribution grid.
Figure 2:
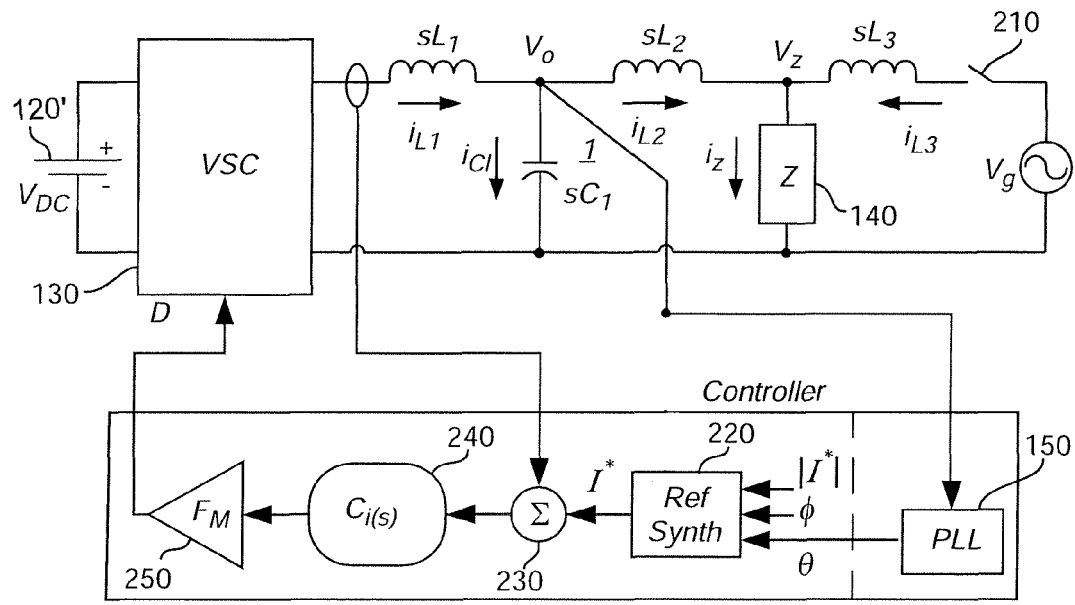
FIG. 2 is a high-level schematic diagram corresponding to FIG. 1.

Referring now to the drawings, and more particularly to FIG. 1, there is shown a high-level block diagram illustrating connection of a voltage source converter (VSC) and generic load, Z, to a power distribution grid. FIG. 2 is a high-level schematic diagram of substantially the same connection containing greater detail for purposes of modeling the connection illustrated more generally in FIG. 1. Since these figures are arranged to facilitate an understanding of the invention and provide an analysis and modeling underlying the invention, no portion of either FIG. 1 or FIG. 2 is admitted to be prior art in regard to the present invention even though they are representations of known portions of a power distribution system.

In FIG. 1, reference numeral 100 indicates a power distribution network or portion of such a network and reference numeral 110 indicates a power distribution grid. The connection of network or network portion 100 (collectively referred to hereinafter as, simply, network 100) and grid 110 is indicated by dashed line 105. It should be understood that a separation of network 100 from grid 110 that leaves the network de-energized, is trivially simple to detect and has little, if any, potential to cause injury or damage to devices connected to the network. On the other hand, the possibility of the network 100 remaining energized when disconnected from the grid, which is of principal interest in regard to the present invention, implies that the network includes an energy source (e.g. a renewable, and thus intermittently available, energy source or energy storage) 120 and a power converter 130, which, for purposes of discussion of the present invention is considered to be a single-phase power converter and, in view of supply of power thereto by energy source 120 will be considered to be and will be referred to as a voltage source converter (VSC). When energy source 120 is a renewable energy source or energy storage, VSC 130 will also provide for control of bi-directional transfer of power.

Under normal conditions, VSC 130 supplies all of the power that is required by load 140, as depicted by arrow 135, and very little, if any, current will flow in the connection to grid 110. The frequency of the voltage waveform output by VSC 130 is stabilized by a phase locked loop (PLL) 150. (A PLL is a type of circuit having an oscillator which can be controlled in frequency in accordance with a detected phase discrepancy between two waveforms.) The current supplied by VSC 130 is detected by a current sensor schematically depicted at 160 since details thereof are unimportant to the successful practice of the invention. The magnitude of voltage, $V_o$, supplied by VSC 130 as well as the frequency of the voltage waveform is detected over connection 170. The voltage and current information and the output of the PLL, a frequency-stabilized waveform, are provided to a converter control 180 which controls switching of the VSC 130 to provide power at the voltage, current level and frequency that may be desired.

In this latter regard, if network 100 is intended to operate autonomously, without connection to a grid 110, a reference frequency signal would be supplied to PLL 150. However, since synchronization of network 100 with the grid 110 is necessary, it should be understood that if the combination of converter control 180 and VSC 130 begins to drift from the frequency and/or phase of the voltage waveform on grid 110, a phase discrepancy between the voltage waveforms output from VSC 130 and grid 110 will be produced and at least a small amount of current will flow from the grid. If this drift is due to a grid 110 normal operating condition transient, the PLL 150 will re-synchronize and cause the converter control 180 and the VSC 130 to become re-aligned with grid 110. The waveform of the voltage from the grid and the waveform of the voltage supplied from VSC 130 will essentially be mixed at the VSC output node $V_o$; producing a voltage waveform having substantially the same frequency only a very slightly diminished initial amplitude (although the two frequencies would "beat" against each other over time) with a phase between the phases of the two voltage waveforms and thus provides a frequency reference for PLL 150 to stabilize the frequency and phase of the VSC output to be in synchronism with the grid. $V_o$ is the grid 110 voltage which is sensed by the control. If connection to grid 110 is lost at position 105, then $V_o$ is driven by VSC 130.

By the same token, it can be readily understood that only negligible current is involved in interaction of the network 100 and grid 110 under normal load matched conditions between VSC 130 and load 140. It follows that disconnection of network 100 from grid 110 is extremely difficult to reliably detect, particularly in a short period of time required by present standards, since such a disconnection is manifested, at least initially, as simply an interruption of a current that is normally negligible. That is, if the frequency reference provided by the grid 110 is disconnected, the network 100 can continue to operate autonomously and will only begin to drift slowly in phase and frequency over a significant period of time while there is no frequency or phase reference in the network for comparison with the VSC 130 output in order to detect the drift. It should also be appreciated that, since phase discrepancies that result in only negligible current from the grid are tolerable, PLL circuits are generally designed to be very stable and of low bandwidth. Therefore, any drift due to lack of a frequency reference for the PLL will be particularly slow and prevents islanding detection within the short period of time specified by present standards such as IEEE 1547.2003, alluded to above. It is not at all intuitive that a PLL can be designed to be highly stable and of low bandwidth to be tolerant of normally occurring (or injected) perturbations consistent with rapidly and inherently becoming unstable and exhibiting an easily detectable response when a reference frequency is unavailable.

It can also be readily understood that passive islanding detection techniques that necessarily rely on sensing a very slight difference in voltage waveform amplitude and/or frequency, rate of change parameters, impedance, harmonics and the like are often ineffective at sensitivities that do not produce large numbers of false detections at potentially numerous regions (non-detection zones, NDZs) within a given network of any practical extent. Similarly, it can be readily understood that active islanding detection arrangements that rely on perturbations such as injected current or power, frequency and/or phase shifting, power pulsing and/or dead time or the like (while not eliminating NDZs) require a trade-off between PLL stability and low bandwidth and lead to local stability concerns since the PLL response to the perturbations must be detected to confirm that islanding or other anomalies are not present.

Therefore, as alluded to above in regard to a three-phase power distribution system, the inventors consider that providing for PLL instability in response to an islanding event is a highly desirable technique for islanding detection in a single-phase power distribution system. The inventors also consider that PLL instability that will inherently provide a unique, characteristic and easily detectable response within a very short period of time but which provides for power converter operation close to nominal specifications for distributed power is also highly desirable even though such characteristics are contrary to normal PLL design for grid-connected power distribution networks and the possibility of providing such performance is largely counter-intuitive.

Figure 2A:
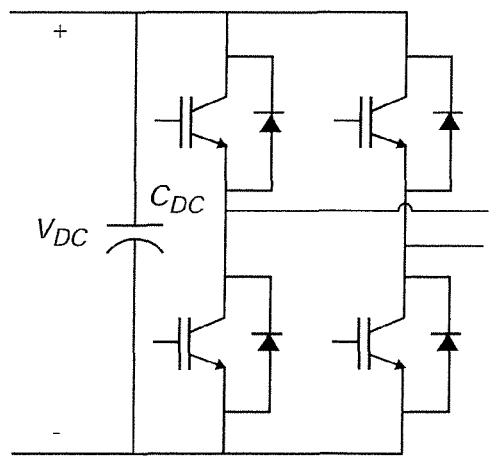
FIG. 2A is a schematic diagram of an exemplary switching circuit for DC to AC conversion.

To approach a PLL design that can produce such meritorious effects, the PLL must be modeled and the model must take all system dynamics, such as the converter dynamics, controller dynamics, grid, load, PLL structure, line impedances, loading and grid source. Referring now to FIG. 2, a schematic diagram of a generalized model including all of these parameters is shown. It will be appreciated that the schematic diagram of FIG. 2 is topologically similar to the block diagram of FIG. 1 with the PLL integrated into the controller and the illustration of the controller expanded to account for system dynamics alluded to above. FIG. 2A is a schematic diagram of an exemplary switching circuit for DC to AC conversion and generalized power source 120 of FIG. 1 is depicted as a DC source 120' in FIG. 2.

For purposes of this discussion, it is assumed that line impedances are simple inductances based on cable and transmission line modeling. Those skilled in the art will be able to accommodate applications where that assumption does not hold, based on the following discussion. It is also to be understood that $|I^*|$ and $\phi$ are determined from a higher level control loop.

In FIG. 2, the potential disconnection from the grid is depicted by switch 210. To accommodate the consideration of system dynamics, the controller is comprised of a PLL 150, a reference signal synthesizer 220, receiving current magnitude, $|I^*|$, and load power factor angle, $\phi$, inputs from a higher level control loop and the voltage phase angle, $\theta$, from the PLL output, a summation circuit 230, receiving sensed current and I* inputs to produce a differential error signal to the input of current loop controller, $C_i(s)$ 240 which generates a duty cycle to the PWM modulator (modeled by gain, $F_M$ 250).

Figure 3:
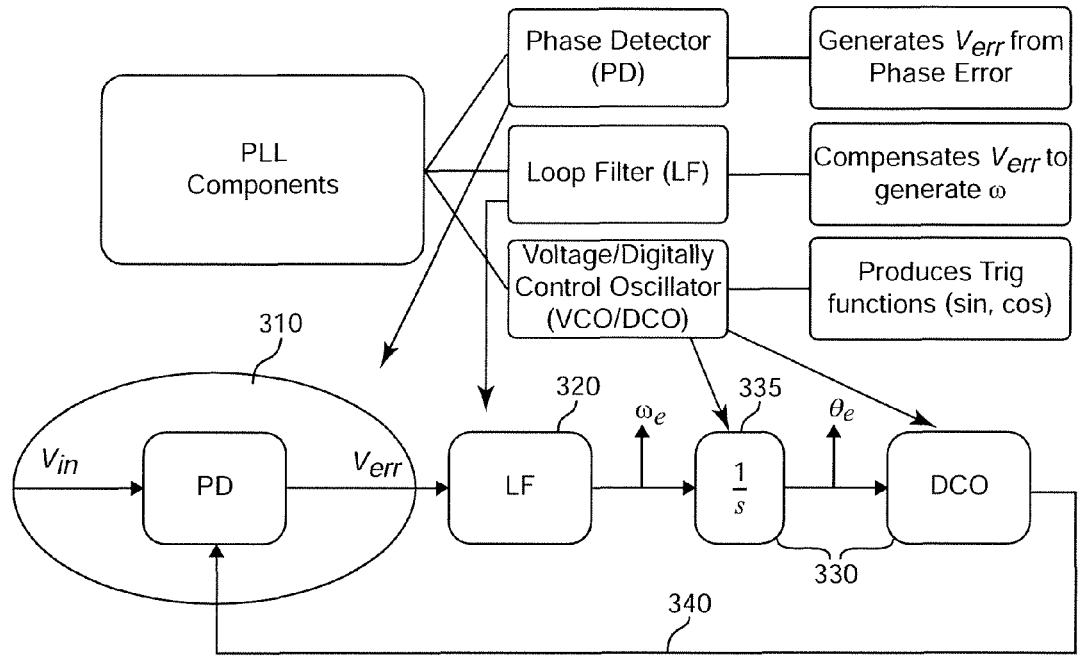
FIG. 3 illustrates the basic constitution of a phase locked loop (PLL) as implemented in the invention.

Referring now to FIG. 3, the basic components of a PLL are a phase detector (PD) 310 receiving an input voltage waveform, $V_{in}$, a loop filter (LF) 320 and a voltage or digitally controlled oscillator (VCO/DCO) 330. VCO/DCO operates to generate an oscillatory signal from the LF 320 and the integrator 335 outputs to be used as a feedback mechanism, via 340, which will, in turn, drive the system to synchronize with input $V_{in}$. In summary, the PD 310 compares the input $V_{in}$ to the output of the VCO/DCO 330 to produce an error signal for LF 320 which, in turn, produces an estimated angular frequency, $\omega_e$ to be used in the islanding detection and then integrated via the Laplace integrator 335 to produce the estimated angle, $\theta_e$, of input $V_{in}$ or PD 310 to compare against.

Figure 4:
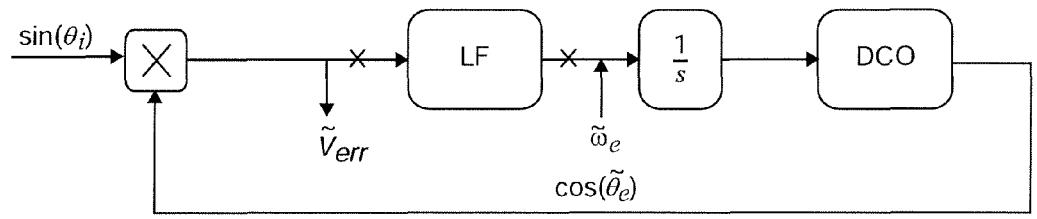
FIG. 4 illustrates standard PLL modeling.

Various phase detector implementations can greatly affect the performance of the PLL. For example, the PLL of FIG. 3 can also be modeled with the PD implemented as a simple multiplier circuit as shown in FIG. 4. When the circuit model is broken at the points indicated by "x" and the transfer function derived, the following is found:

$$\tilde{V}_{err}/\tilde{\omega}_e = \cos(\psi)/s$$

where $\psi$ is the phase angle mismatch between the input and estimated values, and, as $\psi$ approaches zero, $$\tilde{V}_{err}/\tilde{\omega}_e = 1/s.$$

Thus, when analyzed by itself, the PLL looks like an integrator with gain. However, under phase-lock conditions, the PLL looks like a pure integrator, but when the estimate is in quadrature with the input, the gain goes to zero. This possibility can theoretically lead to phase locked conditions which are not actually synchronized to the input.

Due to the trigonometric relationship of the standard sinusoidal multiplier phase detector (SMPD), time domain transient response generates a $2\omega$ ripple:

$$V_{err} = A \sin(\omega t + \psi)\cos(\omega t)$$

and, as $\psi$ approaches zero, the ripple term persists in $V_{err}$:

$$LF = K_p K_i/s.$$

Figure 5:
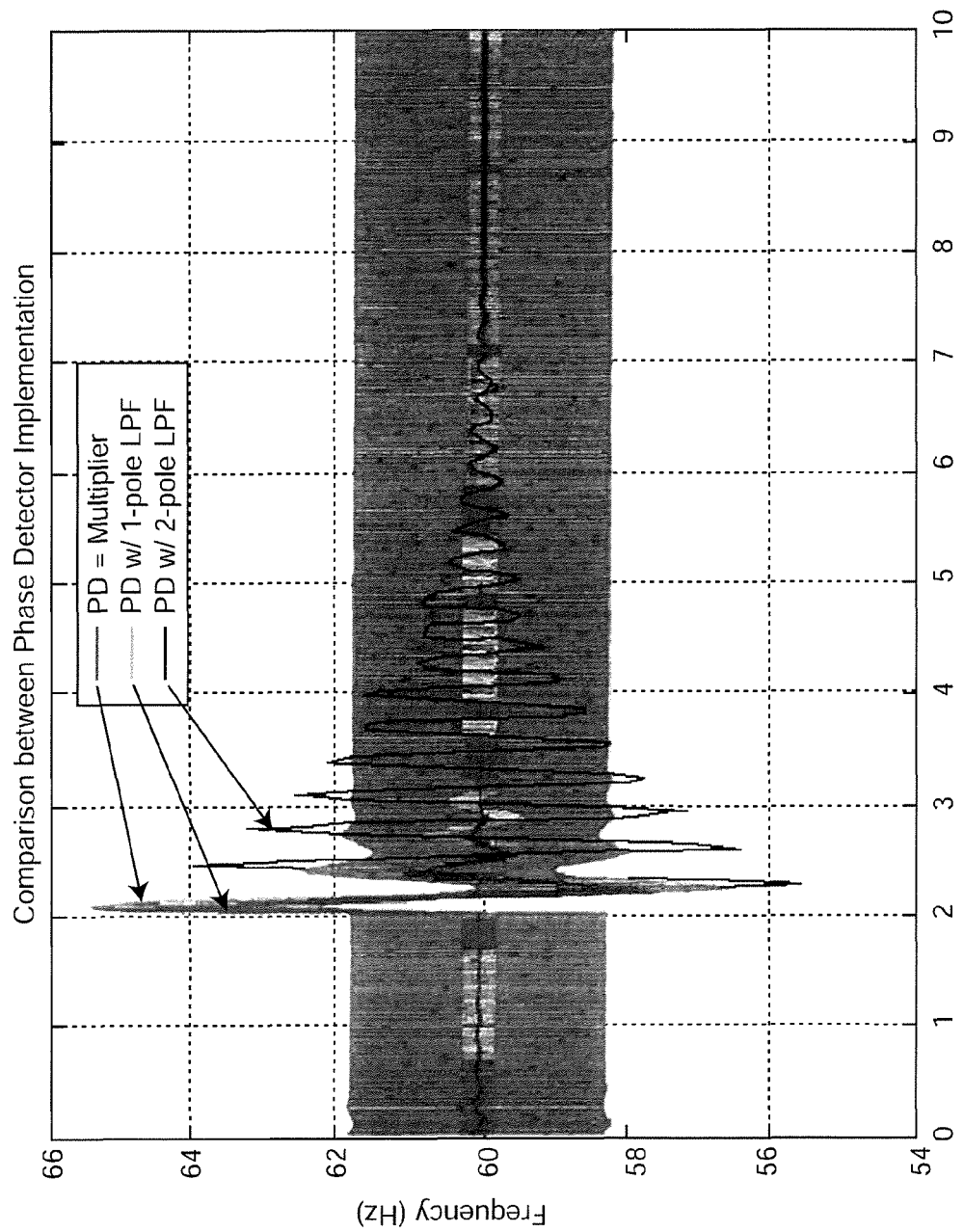
FIG. 5 illustrates a comparison of transient responses of different implementations of a phase detector (PD) in a PLL.

The generic loop filter, being a proportional integrator (PT) regulator structure, attenuates the ripple but cannot completely eliminate it. Additional low-pass filters (LPFs) can also be added to reduce the ripple effects but only at the cost of system dynamics (e.g. slower transient response, etc.). Reducing PI gain causes the bandwidth to be reduced and results in undesirable longer response times while adding LPFs leads to a decrease in loop filter phase margins (PM, a stability criterion) as well as increasing the order of the system response and, again, causing undesirably longer transient response times. A comparison between phase detector implementations (SMPD, SMPD with one pole LPF and SMPD with two pole LPF) is shown in FIG. 5.

Figure 6:
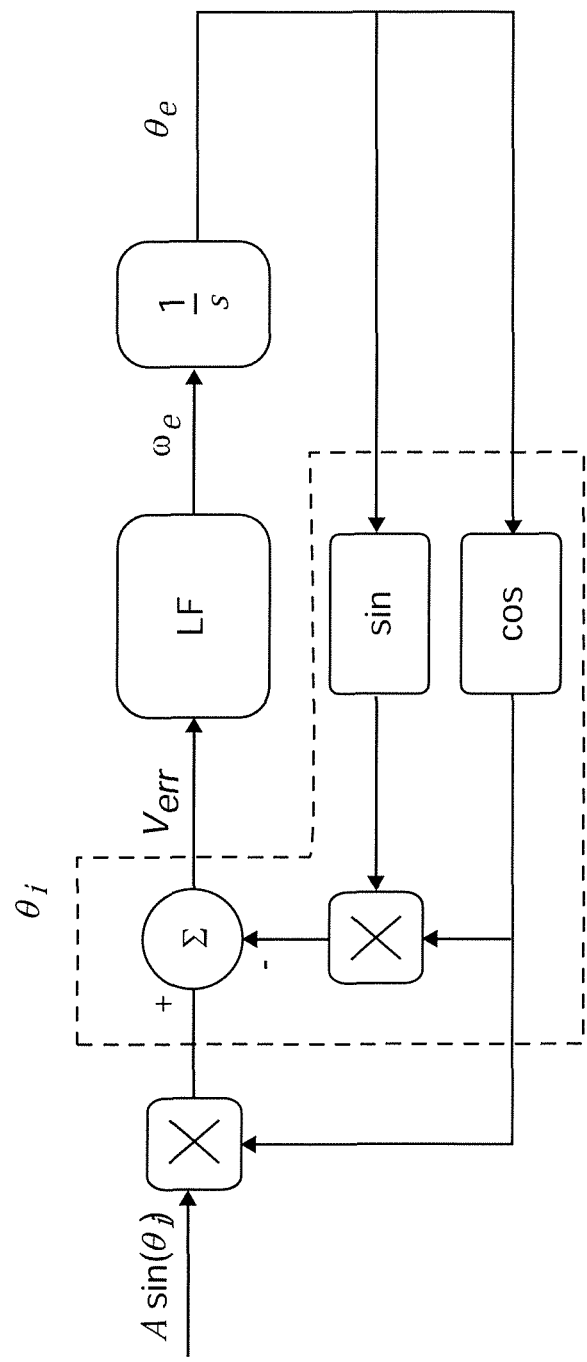
FIG. 6 is a block diagram of a phase detector in accordance with the invention.
Figure 7:
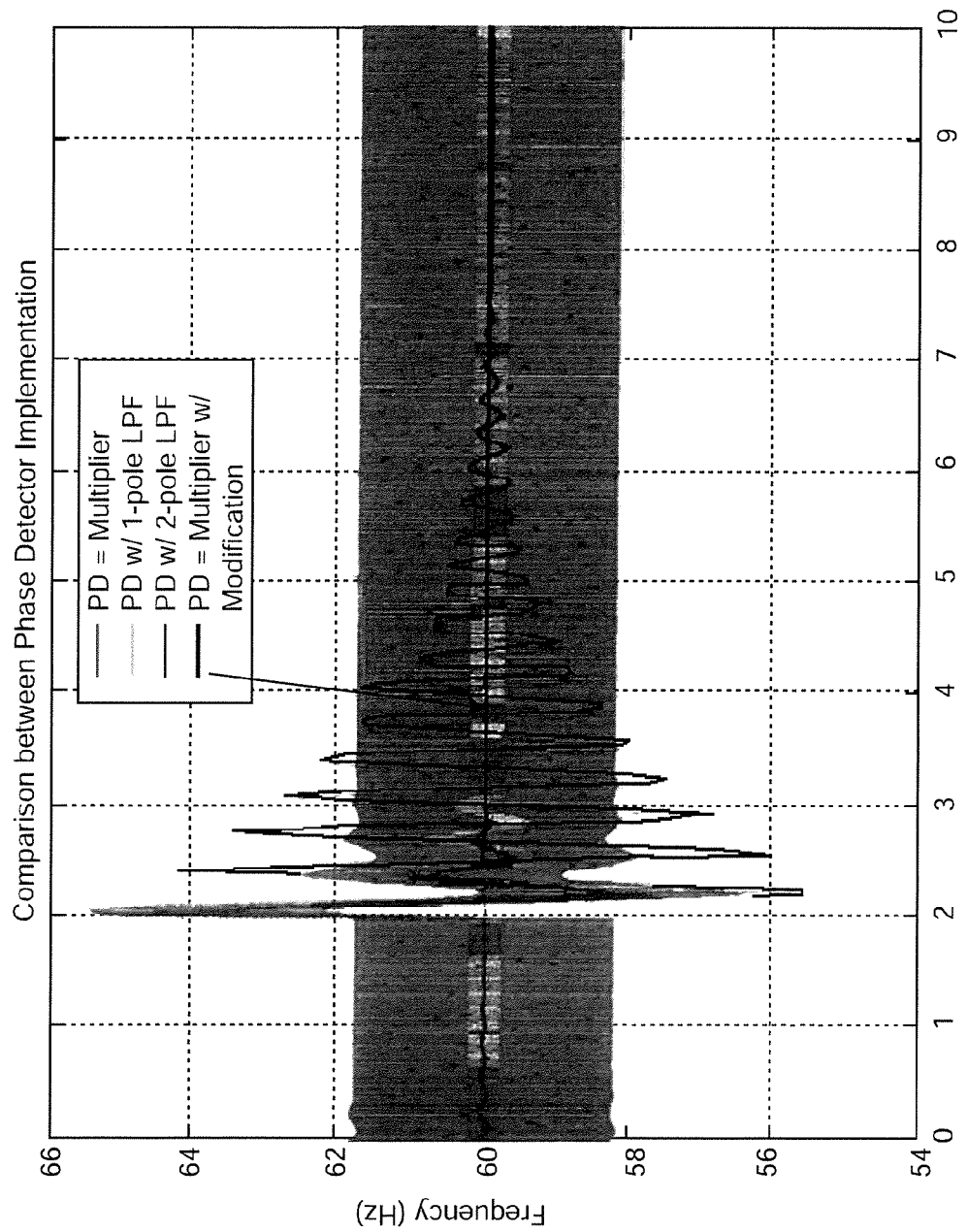
FIG. 7 illustrates the time-domain response of the phase detector of FIG. 6.

In a digitally implemented system, low pass filters (LPFs) are simple to create but are not ideal in their performance effects on the system. In any case, as indicated above, LPFs decrease transient response time which is undesirable for meeting present islanding detection standards and specifications. However, coded trigonometric functions (sines and cosines) can manipulate the PD output to completely eliminate the steady state ripple caused by the multiplication of the input and VCO/DCO output. Accordingly, it has been found by the inventors that the modified multiplier phase detector (MMPD) illustrated in FIG. 6 is substantially more ideal in its response and much more preferred for practice of the invention. In the MMPD illustrated, two feedback loops computing the sine and cosine of $\theta_e$ are provided and the outputs thereof are multiplied and summed with the results of multiplying the output of the cosine loop by $A \sin(\theta_i)$ where $\theta_i = \theta_e + \psi$ which can be expressed as $$V_{err} = A \sin(\theta_e + \psi)\cos(\theta_e) - \sin(\theta_e)\cos(\theta_e).$$

Recalling the relationship of $\theta$ and $\omega$ discussed above in connection with FIG. 3, the computation of the MMPD can be expressed as $$V_{err} = A \sin(\omega t + \psi)\cos(\omega t) - \sin(\omega t)\cos(\omega t).$$

From this expression, it is seen that when $A \approx 1$, it follows that $\psi = 0$ and $V_{err} = 0$. Further, from this expression, after suitable trigonometric and algebraic conversion, it can be shown that, during transients, when $\psi \neq 0$, the DC term resulting from the conversion settles to a new steady state and, if $A = 1$, the open loop transfer function is very similar to the original system using a SMPD discussed above and the response to the perturbation of $\omega$, discussed above, is substantially the same. Indeed, both simulation and experimental confirmation showing that the ripple is substantially eliminated within a short time following a transient (such as may be caused by onset of an islanding event) if the connection to the grid remains intact.

Figure 9A:
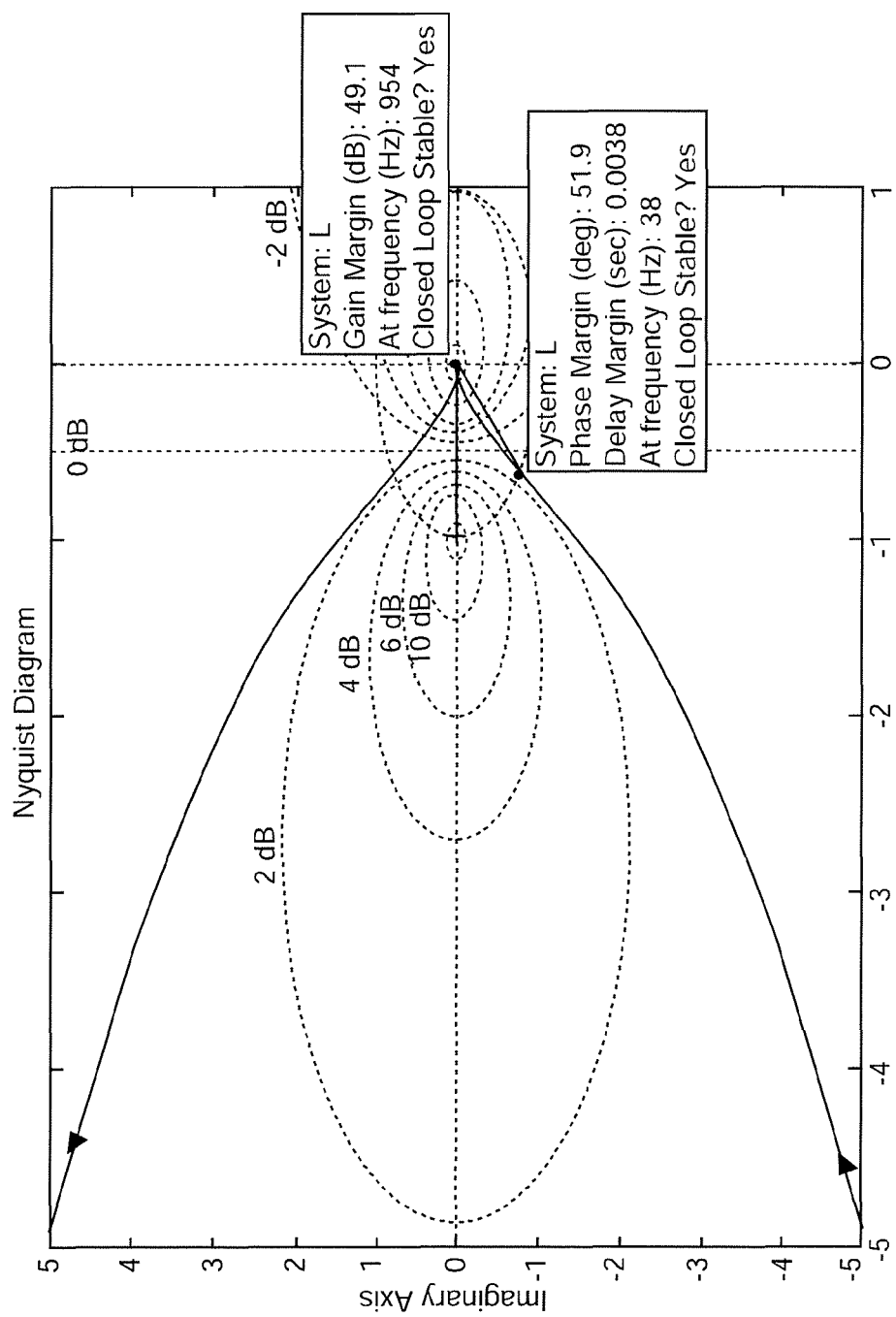
FIG. 9A is a Nyquist diagram corresponding to the stability aspects of a sinusoidal multiplier phase detector (SMPD)

In other words, while a reference frequency remains available for the PLL to track (e.g. in the grid-connected mode (GCM)), the MMPD in accordance with the invention will perform similarly to an SMPD which is functionally equivalent to a well-known balanced mixer. The output of the SMPD will be the trigonometric relationship of a sine/cosine product which produces a difference and summation of the system and estimated frequencies. When in phase/frequency lock, the PLL tracks the system frequency and the difference term goes to zero while the summation term generates a second harmonic ripple signal. The Nyquist plot of the SMPD discussed above which the MMPD of the invention emulates during GCM is shown in FIG. 9A and, since the −1 point is not encircled, confirms that the PLL is stable. However, the MMPD in accordance with the invention quickly reduces and substantially eliminates the transient and second harmonic terms commonly associated with SMPDs without the need for additional LPFs that would reduce speed of response.

Figure 9B:
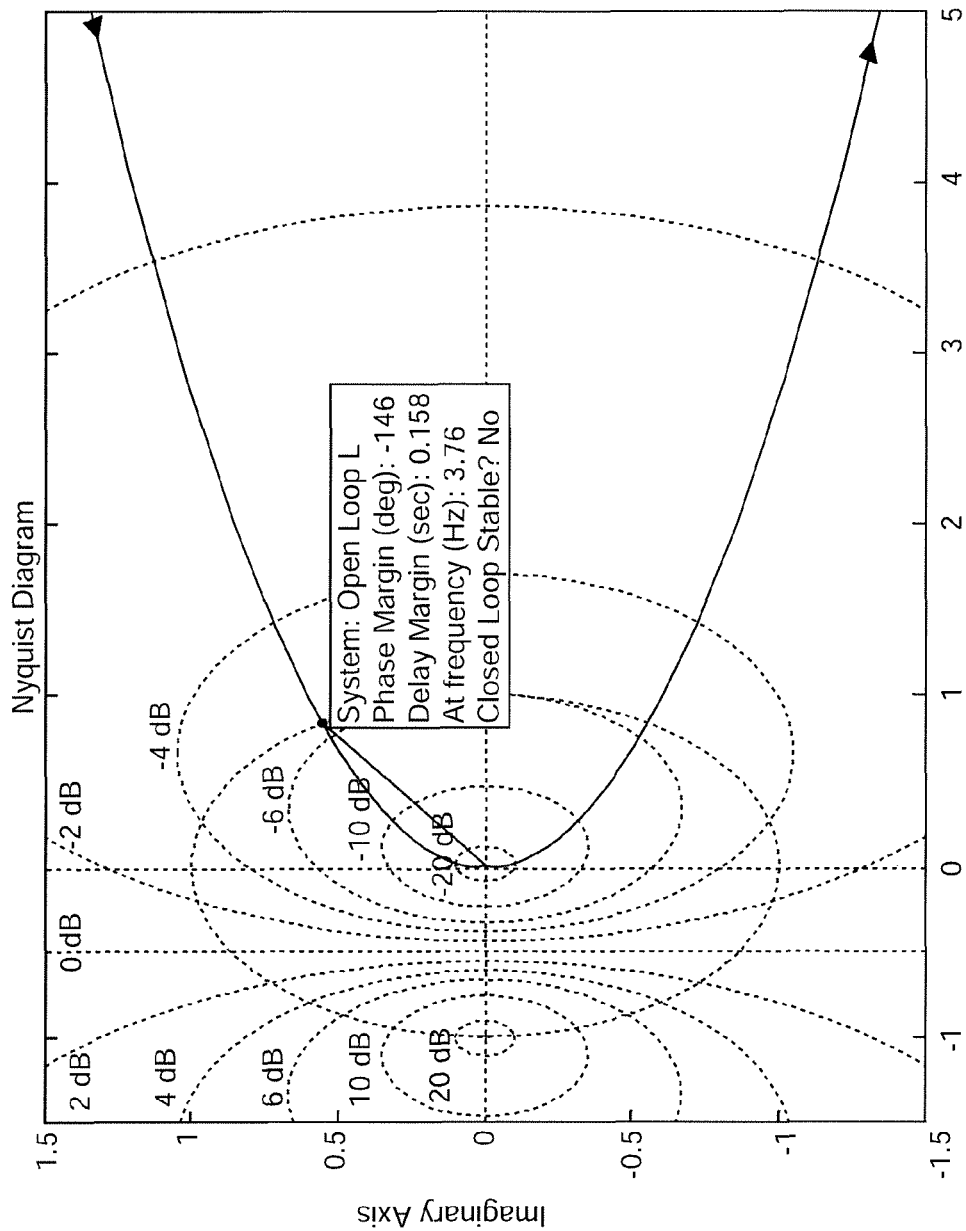
FIG. 9B is a Nyquist diagram of the stability aspects of a modified multiplier phase detector (MMPD) in accordance with the invention.
Figure 10:
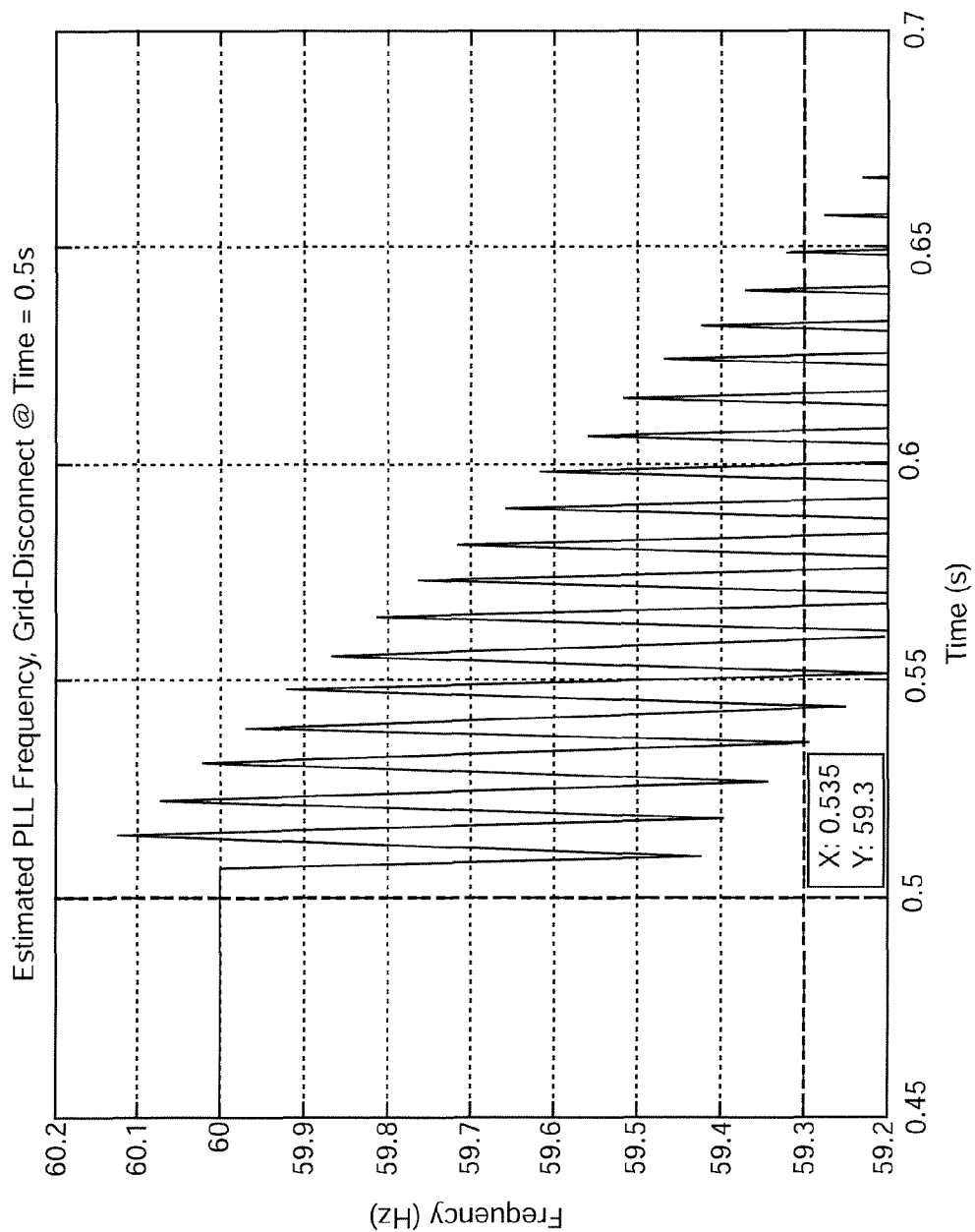
FIG. 10 illustrates exemplary response of a PLL including the MMPD of the invention upon onset of grid disconnected mode (GDM)

Moreover, an analysis and derivation of the open loop transfer function of the MMPD in accordance with the invention provided in "Single-Phase Islanding Detection based on Phase-Locked Loop Stability" by Thacker et al. and which forms a part of the above U.S. Provisional Patent Application 61/364,206, fully incorporated by reference, above, shows that the open loop transfer function of the MMPD in accordance with the invention virtually eliminates NDZs by causing the PLL to rapidly become unstable and forcing $\omega$ to oscillate and be driven outside the nominal operating frequency range, a condition which is persistent and readily detectable, when a reference frequency is not available (e.g. in the grid-disconnected mode (GDM)). The Nyquist diagram for the MMPD during GDM is shown in FIG. 9B and, since the −1 point is encircled, the MMPD is inherently and unconditionally unstable during GDM. A graph of the simulated frequency response of a PLL including a MMPD in accordance with the invention at the onset of GDM or following a transient is shown in FIG. 10. In other words, during GCM, the use of the PLL including the phase detector in accordance with the invention acts as a positive feed forward mechanism which will not affect stability. However, when in GDM, the same mechanism becomes a positive feedback term, which inherently will cause any system to become unstable.

On the other hand for transients not representing GDM and for GDM that exists only for a short period of time the SMPD function of the MMPD remains stable and the SMPD essentially tracks itself until the instability of the MMPD function drives the frequency to drift from the nominal operating frequency range. The period for this frequency drift to occur varies with loading and can be computed as shown in the portion of the above-incorporated U.S. Provisional Patent Application referenced above.

Figure 8:
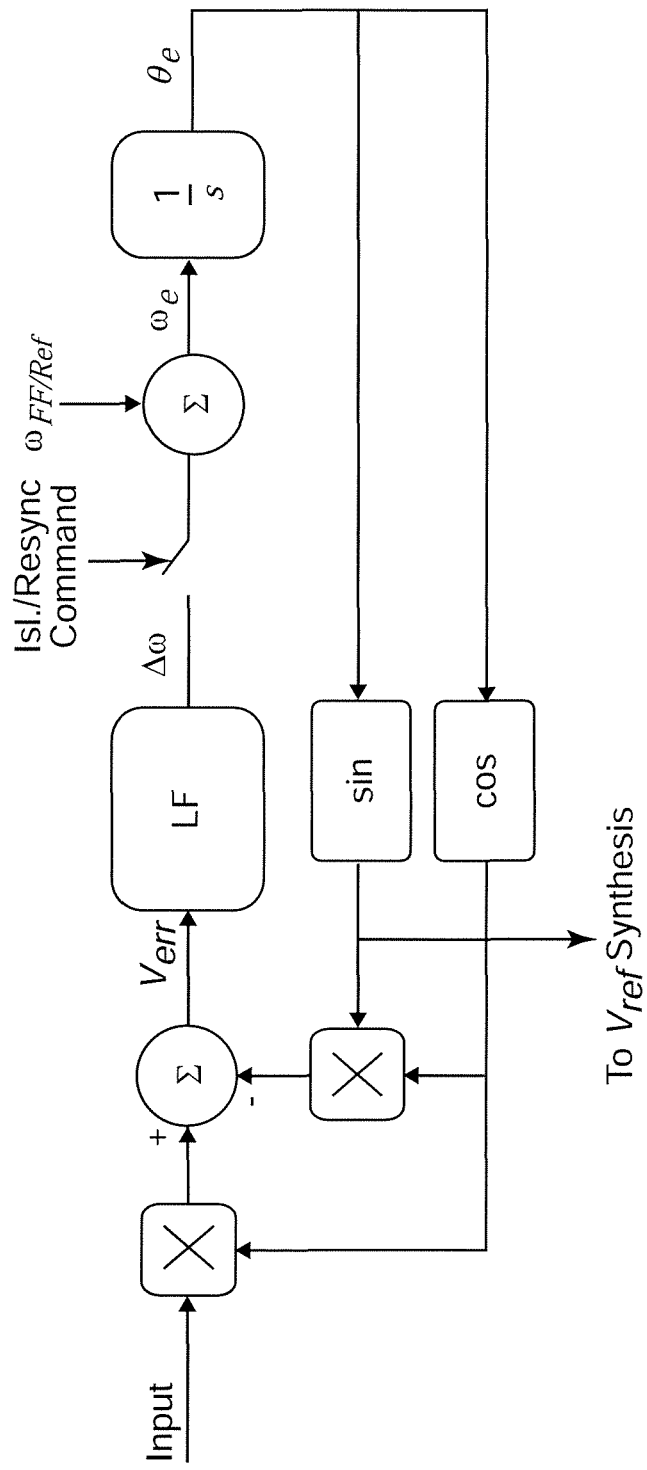
FIG. 8 is a block diagram of the phase detector of FIG. 6 useful for understanding the functioning thereof in accordance with the invention.

The operation of the phase detector for re-closure to the grid after an islanding event has been cleared (e.g. transitioning from GDM to GCM can be visualized as illustrated in FIG. 8. The depiction in FIG. 8 is the same as that of FIG. 6 except that a constant reference term that is the ideal grid frequency is shown as being summed with the $\Delta\omega$ output of the loop filter and a re-synchronization command which is responsive to GDM detection is depicted as a switch that can bring the system into a stand-alone mode of operation, if allowed within the system. As such, the PLL will not operate to essentially track itself since the PLL is only engaged when grid-connected. Thus the phase detector acts as a control system that relays a signal back to the PLL to establish what operational mode (GCM or GDM) the PLL is in. Thus, depending on control system status, the PLL either tracks the input signal seen or disengages the tracking system and produces a constant frequency signal that will cause the output of the PLL to oscillate and drift in frequency. It should be noted that angle generation is not interrupted between GCM and GDM but, rather, the phase detector transitions the PLL into a simple oscillator for reference generation.

As alluded to above, a low bandwidth is desirable at steady-state operation to increase stability and for rejection of harmonics and noise in the phase detector and PLL. However, during transients, due to input disturbances, it is desirable to have a large bandwidth such that response time is decreased. It has been shown above that use of an MMPD can respond quickly to loss of a frequency reference or other transients but that $\omega$ is quickly damped when a frequency reference is available (e.g. GCM) but persists when a frequency reference is not (e.g. GDM). Therefore, as a perfecting feature of the invention which is not necessary to its practice in accordance with its basic principles, the effect of increased bandwidth can be achieved by providing for an additional frequency feedback term in the MMPD described above.

Figure 11:
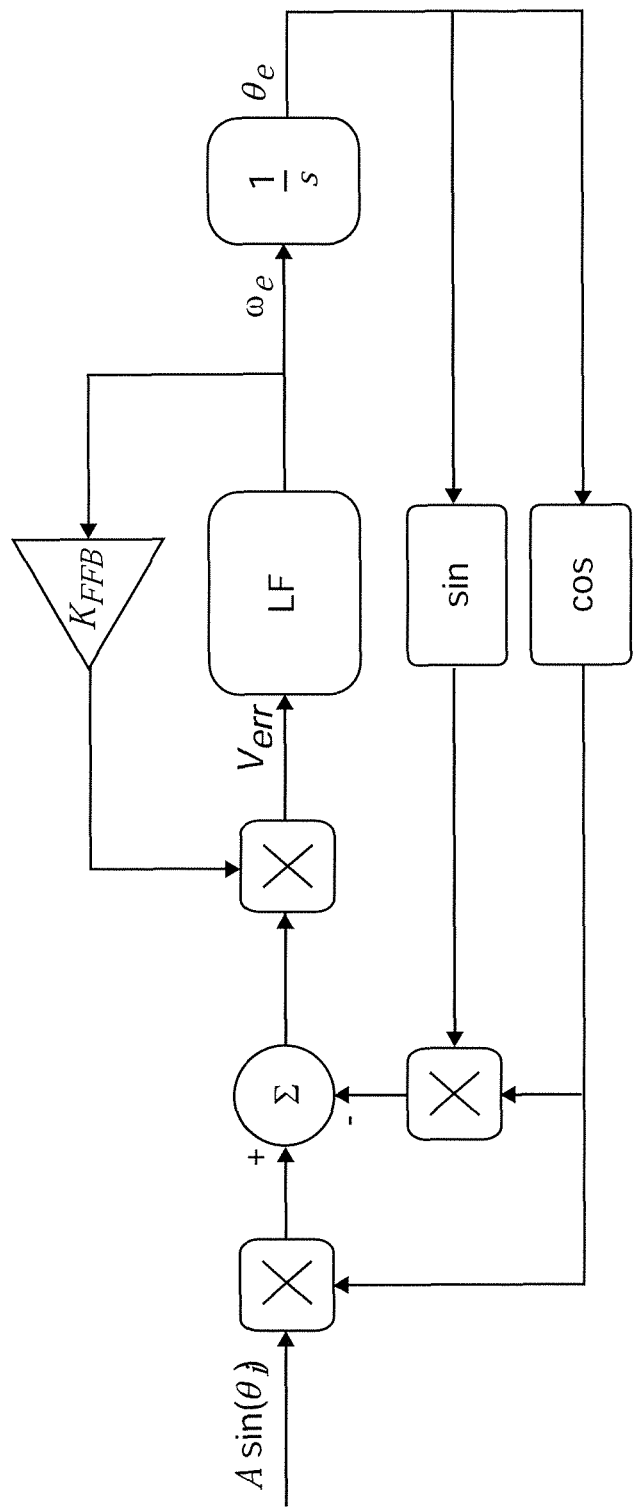
FIG. 11 is a block diagram illustrating a variant embodiment of the MMPD of FIG. 6.

Specifically, referring to FIG. 11, a variant embodiment of the MMPD described above is shown. This variant embodiment is the same as that described above except that $\omega_e$ is multiplied by a constant $K_{FFB}$ gain term and used as a multiplier for the difference of the two trigonometric products. Thus for this variant embodiment, the error signal developed can be expressed as:

$$V_{err} = K_{FFB} \cdot \omega_e \cdot [A \sin(\theta_e + \psi)\cos(\theta_e) - \sin(\theta_e)\cos(_e)].$$

Thus, during GCM where $A \approx 1$, $K_{FFB} \cdot \omega_e$ will not have a significant effect on the steady state but during GDM where $A \neq 1$, $K_{FFB} \cdot \omega_e$ will amplify the $2\omega$ ripple term during transients and at steady state. This multiplication will thus increase the amplitude of the PLL response that is indicative of islanding and increases reliability of detection and reduces response time.

Figure 11A:
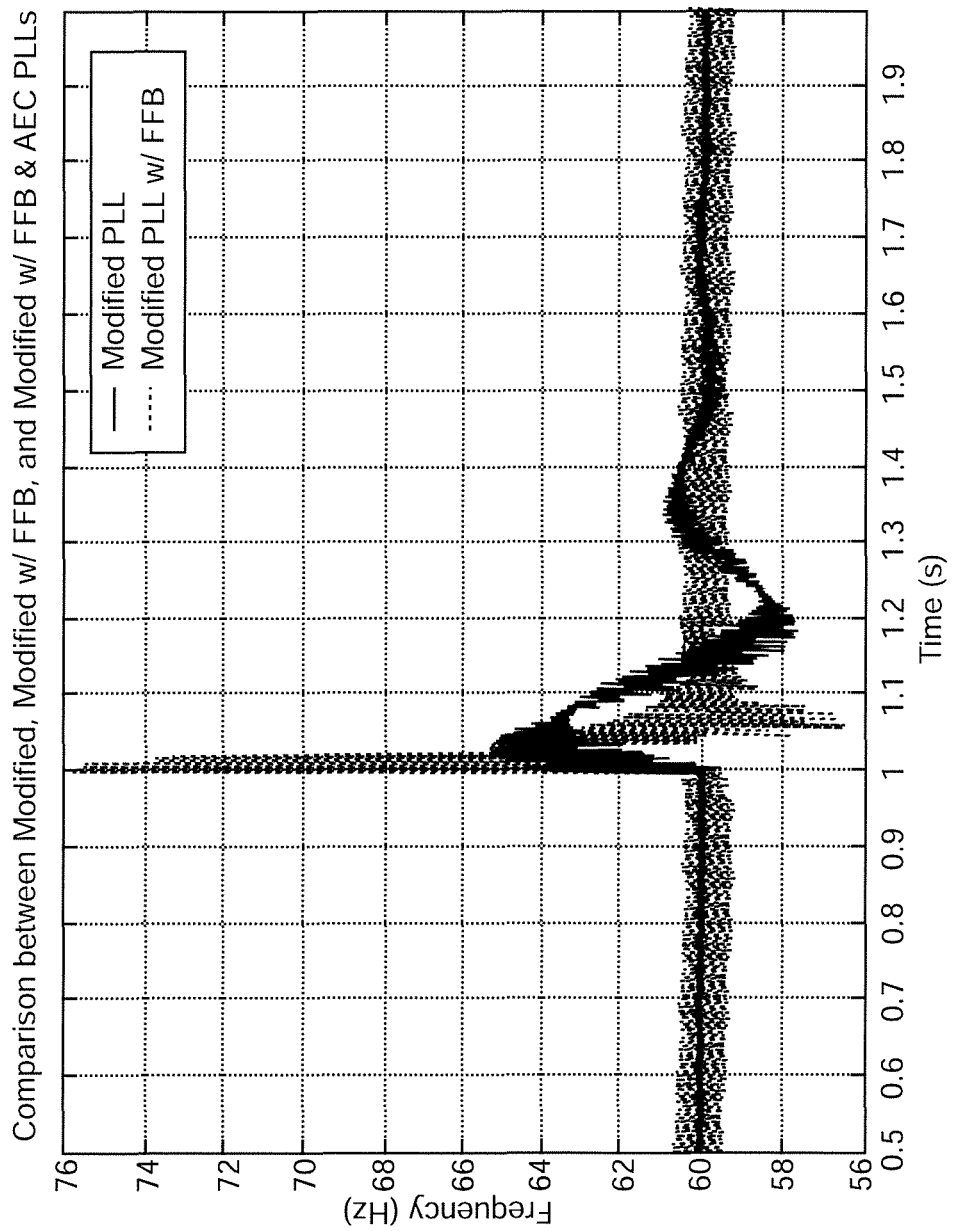
FIG. 11A illustrates the response of the variant embodiment of FIG. 11 upon onset of GDM.
Figure 12:
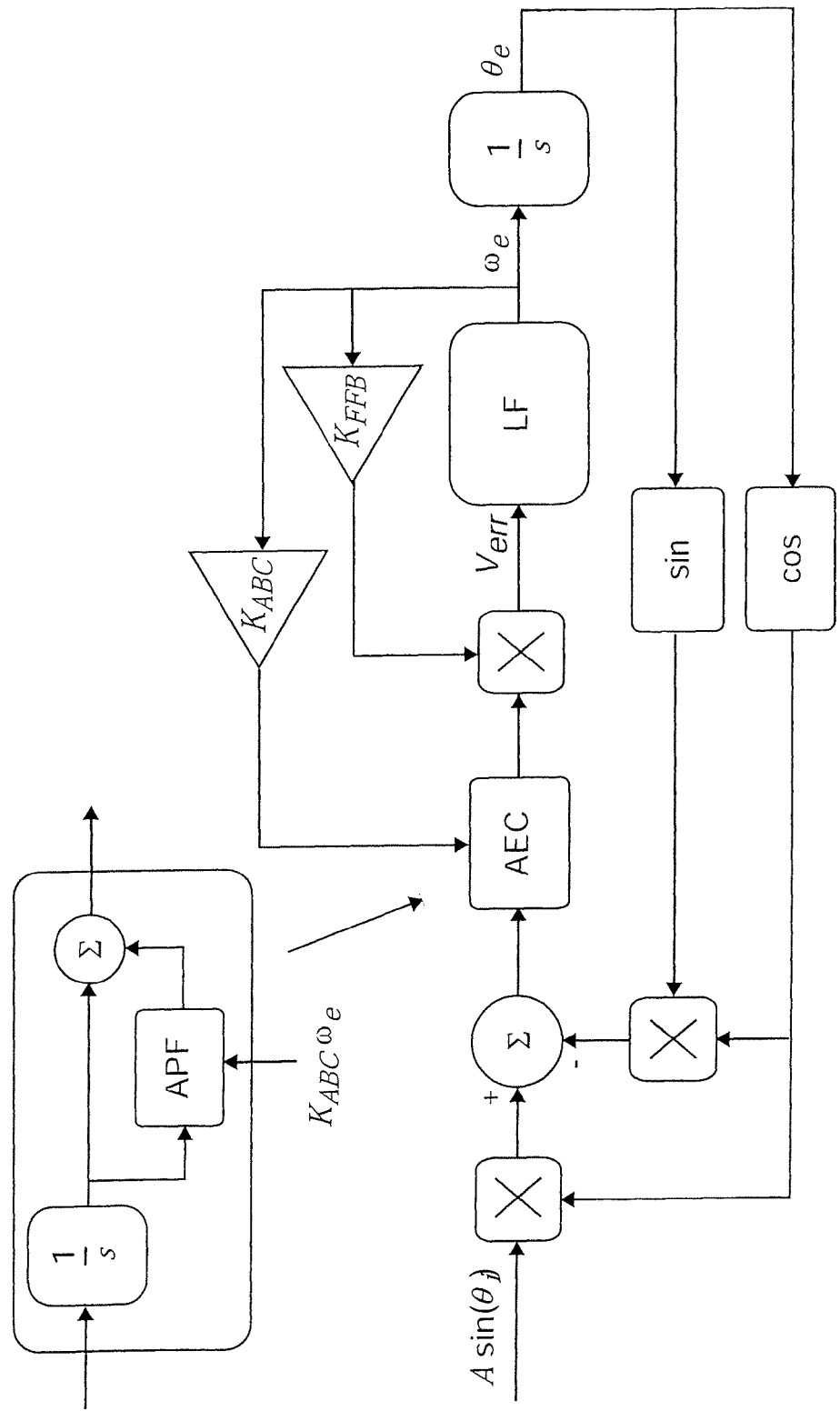
FIG. 12 illustrates inclusion of amplitude error correction to the MMPD of FIG. 11.

However, such an increase in gain may cause the amplitude mismatch, A, to produce an excessive frequency change response as shown in FIG. 11A such that an amplitude error correction (AEC) that creates cancellation terms to cancel amplitude mismatches may be required. In the illustrated implementation, the AEC is comprised of an all-pass filter (APF), integrator and summation circuit. This circuit essentially eliminates the effects of the amplitude mismatch as illustrated in expanded form in FIG. 12.

In view of the foregoing, it is seen that the invention provides a technique for islanding detection that substantially eliminates NDZs by providing PLL control of a switching converter such as a VSC that will quickly become unstable and exhibit a readily detectable response during such instability upon a reference frequency becoming unavailable for the PLL. The MMPD in accordance with the invention that provides such conditional stability is tolerant of transients and noise which are likely to be present in a power distribution network or grid but can respond quickly to a transition from GCM to GDM. Simulated and experimental results are well-correlated in this regard and, while islanding detection time varies with loading conditions of the network, as summarized in Table A, detection time for any load condition is sufficiently short (in line cycles) to substantially exceed present standards specifying detection within ten line cycles or less.

TABLE A

| Loading Condition | Islanding Detection Time line-cycles |
|---|---|
| Simulated, R = 25Ω | 3.57 |
| Simulated, RLC, $Q_f = 1.0$ | 4.56 |
| Simulated, RLC, $Q_f = 2.5$ | 6.06 |
| Experimental, Battery Charging | <1.0 |
| Experimental, Z = R | ~3.5-4.0 |
| Experimental, Z = RLC $Q_f = 1.4$ | ~5.0 |

Thus, it is clearly seen that the invention overcomes many problems associated with well-known techniques for active and passive islanding described above in accordance with the basic principle of designing the LF transfer function of a PLL to rapidly and inherently become unstable when a reference frequency is not available and is preferably achieved by phase detector design; a preferred exemplary form of which has been discussed in detail above although other designs will be evident to those skilled in the art.

While the invention has been described in terms of a single preferred embodiment, those skilled in the art will recognize that the invention can be practiced with modification within the spirit and scope of the appended claims.

The invention claimed is:

1. A phase detector configured to compute an error signal, $V_{err}$, in accordance with the equation:

$$V_{err} = A \sin(\theta_e + \psi)\cos(\theta_e) - \sin(\theta_e)\cos(\theta_e),$$

wherein $\theta_e$ is an estimated angle of input $V_{in}$ and $\psi$ is a phase angle mismatch between the input and estimated values.

2. A phase detector as recited in claim 1, wherein said phase detector comprises
   a loop filter,
   an integrator connected to an output of said loop filter,
   a first feedback path configured to compute a sine of the output of said integrator,
   a second feedback path configured to compute a cosine of the output of said integrator,
   a first multiplier configured to multiply an output of said first feedback path and an output of said second feedback path,
   a second multiplier configured to multiply said output of said second feedback path by an input, a summation device configured to output a difference of outputs of said first multiplier and said second multiplier, and
   a connection from an output of said summation device to an input of said loop filter.

3. A phase detector as recited in claim 2, further comprising
a third feedback path from an output of said loop filter, said third feedback path including gain, wherein said connection includes
a third multiplier for multiplying an output of said summation device and an output of said third feedback path.

4. A phase detector as recited in claim 3, said phase detector further comprising
an amplitude error correction circuit, and
a fourth feedback path for providing a signal corresponding to an output of said loop filter to said amplitude error correction circuit.

5. A phase detector as recited in claim 4 wherein said amplitude error correction circuit comprises
a further integrator,
an all pass filter, and
a further summation circuit configured to sum an output of said further integrator and an output of said all pass filter.

6. A phase detector as recited in claim 1, further comprising
a feedback path from an output of a loop filter, said feedback path including gain, and a multiplier for multiplying said error signal and an output of said feedback path.

7. A phase detector as recited in claim 6, said phase detector further comprising
an amplitude error correction circuit, and
a further feedback path for providing a signal corresponding to an output of said loop filter to said amplitude error correction circuit.

8. A phase detector as recited in claim 7 wherein said amplitude error correction circuit comprises
an integrator,
an all pass filter, and
a further summation circuit configured to sum an output of said integrator and an output of said all pass filter.

9. A phase-locked loop circuit including a phase detector configured to compute an error signal, $V_{err}$, in accordance with the equation:

$$V_{err}=A\sin(\theta_e+\psi)\cos(\theta_e)-\sin(\theta_e)\cos(\theta_e),$$

wherein $\theta_e$ is an estimated angle of input $V_{in}$ and $\psi$ is a phase angle mismatch between the input and estimated values.

10. A phase-locked loop circuit as recited in claim 9, wherein said phase detector comprises a loop filter,
an integrator connected to an output of said loop filter,
a first feedback path configured to compute a sine of the output of said integrator,
a second feedback path configured to compute a cosine of the output of said integrator,
a first multiplier configured to multiply an output of said first feedback path and an output of said second feedback path,
a second multiplier configured to multiply said output of said second feedback path by an input, a summation device configured to output a difference of outputs of said first multiplier and said second multiplier, and
a connection from an output of said summation device to an input of said loop filter.

11. A phase-locked loop circuit as recited in claim 10, wherein said phase detector further comprises a third feedback path from an output of said loop filter, said third feedback path including gain, wherein said connection includes
a third multiplier for multiplying an output of said summation device and an output of said third feedback path.

12. A phase-locked loop circuit as recited in claim 11, wherein said phase detector further comprises
an amplitude error correction circuit, and
a fourth feedback path for providing a signal corresponding to an output of said loop filter to said amplitude error correction circuit.

13. A phase-locked loop circuit as recited in claim 12 wherein said amplitude error correction circuit comprises
a further integrator,
an all pass filter, and
a further summation circuit configured to sum an output of said further integrator and an output of said all pass filter.

14. A phase-locked loop circuit as recited in claim 9, further comprising
a feedback path from an output of a loop filter, said feedback path including gain, and
a multiplier for multiplying said error signal and an output of said feedback path.

15. A phase-locked loop as recited in claim 14, said phase detector further comprising
an amplitude error correction circuit, and
a further feedback path for providing a signal corresponding to an output of said loop filter to said amplitude error correction circuit.

16. A phase-locked loop as recited in claim 15 wherein said amplitude error correction circuit comprises
an integrator,
an all pass filter, and
a further summation circuit configured to sum an output of said integrator and an output of said all pass filter.

17. A controller for a power converter including a phase detector configured to compute an error signal, $V_{err}$, in accordance with the equation:

$$V_{err}=A\sin(\theta_e+\psi)\cos(\theta_e)-\sin(\theta_e)\cos(\theta_e),$$

wherein $\theta_e$ is an estimated angle of input $V_{in}$ and $\psi$ is a phase angle mismatch between the input and estimated values.

18. A controller as recited in claim 17, wherein said phase detector comprises
a loop filter,
an integrator connected to an output of said loop filter,
a first feedback path configured to compute a sine of the output of said integrator,
a second feedback path configured to compute a cosine of the output of said integrator,
a first multiplier configured to multiply an output of said first feedback path and an output of said second feedback path,
a second multiplier configured to multiply said output of said second feedback path by an input,
a summation device configured to output a difference of outputs of said first multiplier and said second multiplier, and
a connection from an output of said summation device to an input of said loop filter.

* * * * *